United States Patent
Hwang

[19]

[11] Patent Number: 5,881,081
[45] Date of Patent: Mar. 9, 1999

[54] AUTOMATIC LASER POWER CONTROL CIRCUIT

[75] Inventor: Yong-Ha Hwang, Sungnam, Rep. of Korea

[73] Assignee: Samsung Electronics Co., Ltd., Kyungki-Do, Rep. of Korea

[21] Appl. No.: 884,637

[22] Filed: Jun. 27, 1997

[30] Foreign Application Priority Data

Jun. 28, 1996 [KR] Rep. of Korea ................. 1996-25445

[51] Int. Cl.⁶ .................................................. H01S 3/096
[52] U.S. Cl. .................................................. 372/38
[58] Field of Search ....................................... 372/38, 29

[56] References Cited

U.S. PATENT DOCUMENTS 5,793,786  8/1998  Furumiya ................................... 372/38
5,798,992  8/1998  Kaneko et al. ............................ 372/38

*Primary Examiner*—James W. Davie
*Attorney, Agent, or Firm*—Sughrue, Mion, Zinn, Macpeack & Seas, PLLC

[57] ABSTRACT

An automatic laser power control circuit comprises a laser diode package, a voltage adjusting unit and a polarity adjusting unit. The laser diode package emits laser light according to an applied voltage, and outputs an electric signal of a voltage proportional to the power of the emitted laser light. The voltage adjusting unit adjusts the voltage applied to said laser diode package based on the voltage of the electric signal outputted from said laser diode package. The polarity adjusting unit changes a polarity of the voltage of the electric signal outputted from said laser diode package so that the polarity is the same as that of the voltage applied to said laser diode package, and supplies the voltage having the changed polarity to said voltage adjusting unit. The automatic laser power control circuit provides an advantage that a monitor diode included in the laser diode package can be compatibly used regardless of its ground type.

3 Claims, 4 Drawing Sheets

AUTOMATIC LASER POWER CONTROL CIRCUIT

BACKGROUND OF THE INVENTION

The present invention relates to an automatic laser power control circuit for an optical disc system, and more particularly, to an automatic laser power control circuit in which a monitor diode for monitoring light power of a laser diode can be used regardless of its ground type.

An optical disc system such as a compact disc player (CDP) or a digital versatile disc player (DVDP) projects laser light on an information recording surface of a disc to read out information. A semiconductor laser diode which has been commonly used as a light source for laser light generally has a poor temperature characteristic. Therefore, the light power of the semiconductor laser diode decreases when temperature rises, while the light power of the semiconductor laser diode increases when temperature decreases. This fluctuation of the light power of the laser diode can cause some errors in reading out information from the disc. Accordingly, the optical disc system includes an automatic laser power control (ALPC) circuit to control the light power of the laser diode to be constant.

FIG. 1 shows a conventional automatic laser power control circuit. A laser diode package 11 includes a laser diode 111 and a monitor diode 112 for monitoring a light power of the laser diode 111. The monitor diode 112 outputs a monitor current I proportional to quantity of the light output from the laser diode 111. A voltage determined by multiplying the monitor current I and resistance R is applied to an amplifying unit 12 via a terminal 6. The amplifying unit 12 amplifies the supplied voltage via first and second amplifiers 121 and 122 into a predetermined amplification factor. The output voltage of the amplifying unit 12 is applied to a base of a transistor 13 via a terminal 5. The transistor 13 turns on/off according to the voltage applied to the base. A collector of the transistor 13 is connected through a coil L to the laser diode 111.

If the light power of the laser diode 111 increases, the monitor current I passing through the monitor diode 112 increases. As the monitor current I increases, a higher voltage than the predetermined voltage corresponding to the constant light power of the laser diode 111 is applied to the terminal 6. Higher voltage applied through the terminal 6 is amplified by the first and the second amplifiers 121 and 122, and the amplified higher voltage is applied to the base of the transistor 13 via terminal 5. As a result, the transistor 13 turns off and the driving current of the laser diode decreases. Accordingly, the increased light power of the laser diode 111 decreases, and thus becomes the same as the above constant light power.

On the contrary, if the light power of the laser diode 111 decreases, the monitor current I passing through the monitor diode 112 decreases and then a lower voltage than the predetermined voltage corresponding to the constant light power of the laser diode 111 is applied to the terminal 6. The lower voltage is amplified by the first and the second amplifiers 121 and 122. The amplified lower voltage is applied to the base of the transistor 13 via the terminal 5, and the transistor 13 turns on. When the transistor 13 turns on, the current passing through the laser diode 111 increases, and the light power of the laser diode 111 increases reach the constant light power corresponding to the predetermined voltage. As described above, the automatic laser power control circuit controls the light power of the laser diode 111 to be constant.

The circuit shown in FIG. 1 uses the laser diode package in which cathodes of the laser diode 111 and the monitor diode 112 are grounded through a common ground terminal. However, there are some commercially available laser diode packages in which an anode of the monitor diode is grounded. The direction of the monitor current of the anode-grounded-type laser diode package is different from that of the monitor current of the cathode-grounded-type laser diode package. Accordingly, the conventional circuit shown in FIG. 1 cannot be used with the two types of the laser diode packages.

SUMMARY OF THE INVENTION

To solve the above problem, it is an object of the present invention to provide an automatic laser power control circuit in which a monitor diode can be compatibly used regardless of its ground type.

To accomplish the above object of the present invention, there is provided an automatic laser power control circuit comprising:

a laser diode package for emitting laser light according to an applied voltage, and outputting an electric signal of a voltage proportional to the power of the emitted laser light; a voltage adjusting unit for adjusting the voltage applied to the laser diode package based on the voltage of the electric signal output from the laser diode package; and a polarity adjusting unit for changing a polarity of the voltage of the electric signal output from the laser diode package so that the polarity is the same as that of the voltage applied to the laser diode package, and supplying the voltage having the changed polarity to the voltage adjusting unit.

BRIEF DESCRIPTION OF THE DRAWINGS

The preferred embodiments are described with reference to the drawings wherein.

DETAILED DESCRIPTION OF THE PREFERRED EMBODIMENT

A preferred embodiment of the present invention will be described with reference to the accompanying drawings FIGS. 2 through 3B.

Figure 1:
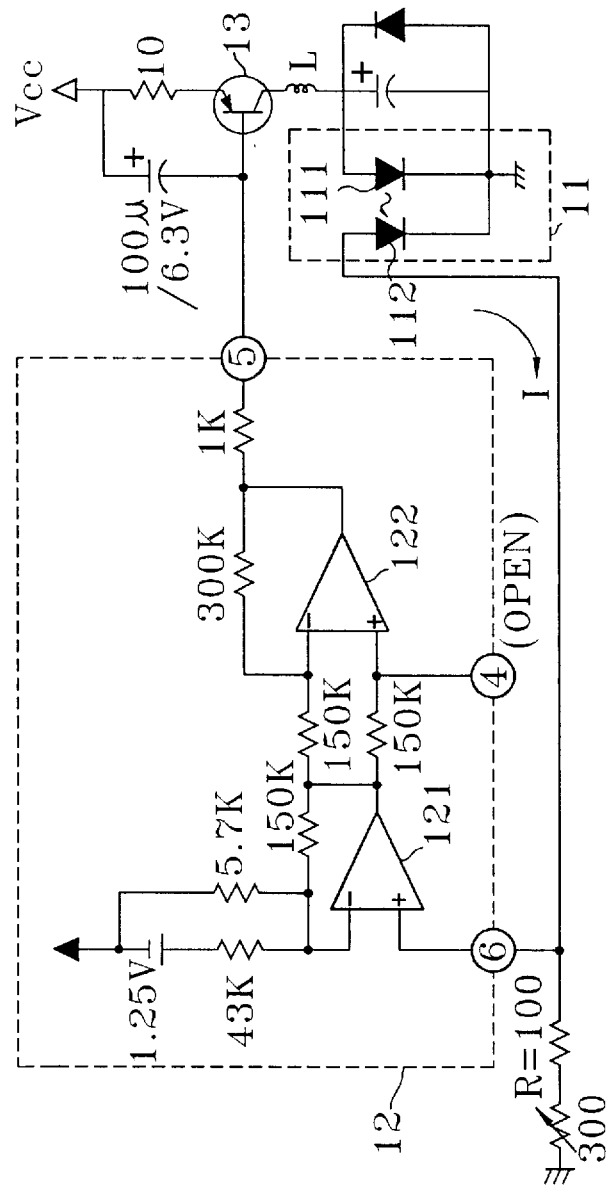
FIG. 1 is a diagram showing a conventional automatic laser power control circuit.
Figure 2:
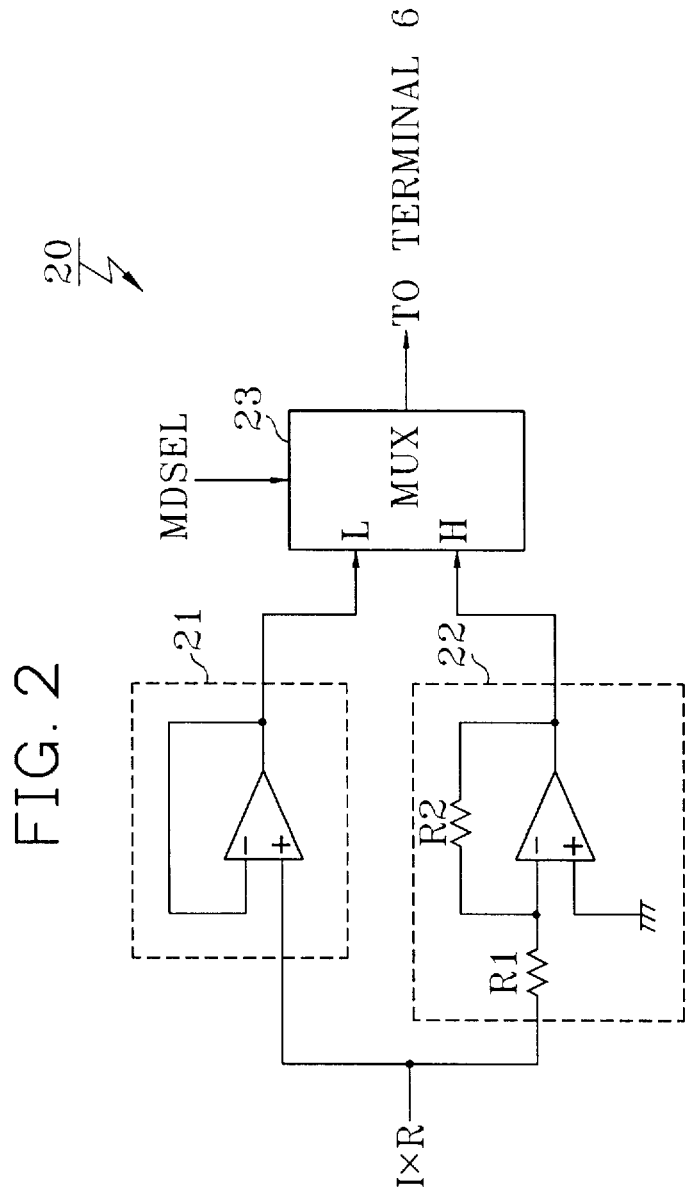
FIG. 2 is a circuit diagram showing a diode type selector according to the present invention.

The voltage determined by multiplication of the monitor current I and the resistance R described referring to FIG. 1 is applied to a diode type selector 20 shown in FIG. 2. A buffer 21 in the diode type selector 20 outputs a voltage having the same polarity as that of the voltage applied thereto. An inverting amplifier 22 which is connected in parallel to the buffer 21 outputs a voltage having an inverted polarity of the voltage applied thereto. An amplification factor of the inverting amplifier 22 is determined in the ratio R2/R1 of resistances R2 and R1. In the present invention, the values of resistances R1, R2 are set to be equal so that the amplification factor becomes "1". A multiplexer 23 receives the output voltages of the buffer 21 and the inverting amplifier 22, selects and outputs one of the input voltages according to a selection control signal MDSEL provided from the external. The selection control signal MDSEL is preset by a designer according to the ground type of the monitor diode. The output of the multiplexer 23 is applied to the terminal 6.

Figure 3A:
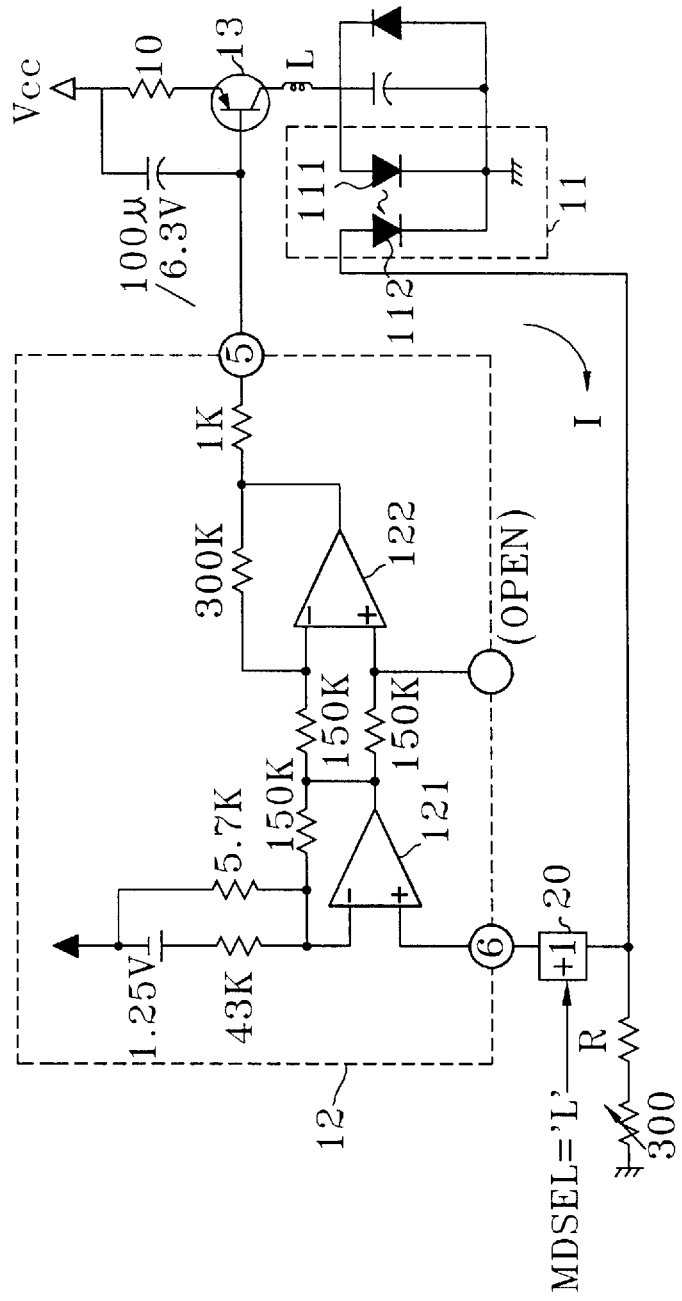
FIGS. 3A and 3B are diagrams showing automatic laser power control circuits employing the diode type selector shown in FIG. 2.
Figure 3B:
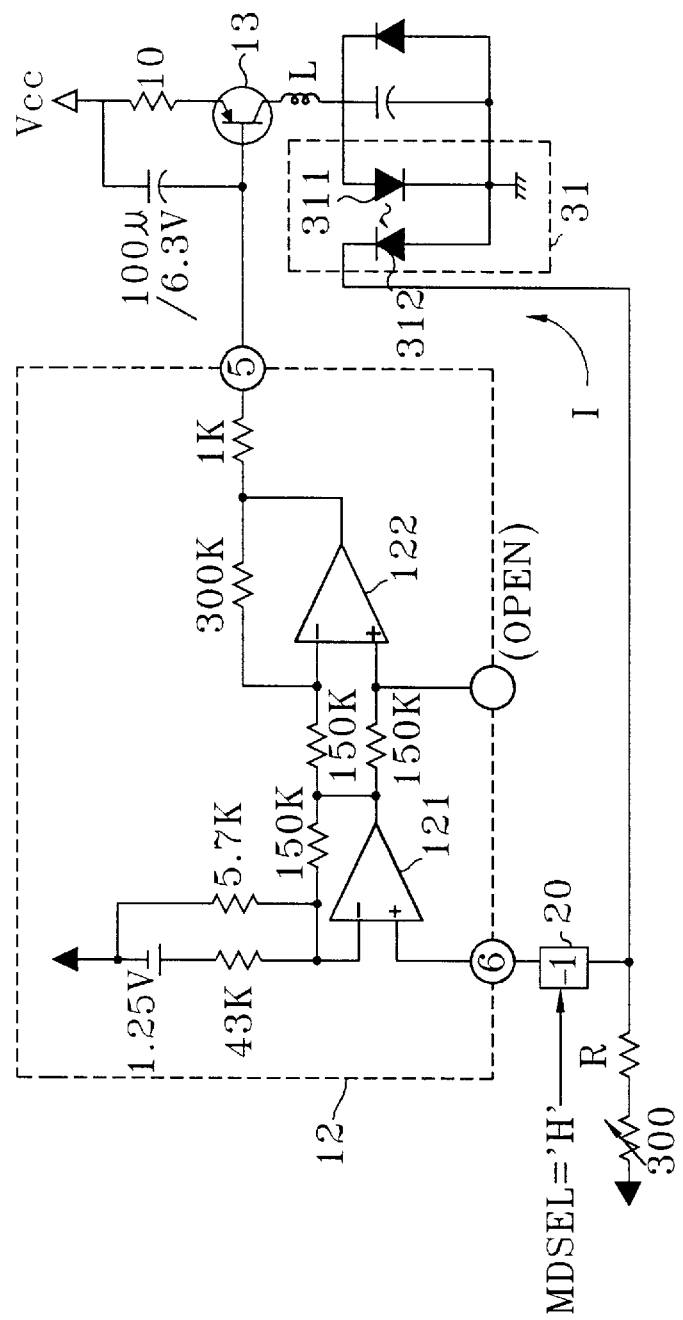

FIGS. 3A and 3B show automatic laser power control circuits employing the diode type selector 20. FIG. 3A shows an example of an automatic laser power control circuit employing the cathode-grounded-type laser diode package 11. When the cathode-grounded-type laser diode package 11 is employed, the designer sets the selection control signal MDSEL of the diode type selector 20 to a low level value "L". In that case, while the control operation of the laser power control circuit is performed, the multiplexer 23 selectively outputs the output of the buffer 21 which is continuously input to its input terminal L. The symbol represented as "+1" within the element designated by the reference numeral 20 in FIG. 3A means that the output of the buffer 21 is selected. Since the operation of FIG. 3A is the same as that of FIG. 1, further description of FIG. 3A will be omitted.

FIG. 3B shows an example of an automatic laser power control circuit employing the anode-grounded-type laser diode package 31. When the anode-grounded-type laser diode package 31 is employed, the designer sets the selection control signal MDSEL of the multiplexer 23 to a high level value "H". In that case, while the control operation of the laser power control circuit is performed, the multiplexer 23 selects the output of the inverting amplifier 22 which is input to an input terminal H, according to the selection control signal MDSEL. The symbol represented as "−1" within the element designated by the reference numeral 20 in FIG. 3B means that the output of the inverting amplifier 22 is selected.

If the light power of the laser diode 311 increases, which increases the monitor current I passing through the monitor diode 312 increases, a lower voltage than the predetermined voltage corresponding to the constant laser power of the laser diode 311 is applied to the terminal 6. That is, when compared with the same case in FIG. 3A, the polarity of the voltage applied to the terminal 6 is different. However, since the diode type selector 20 selects the output of the inverting amplifier 22, a high voltage, as in the case of FIG. 3A, is applied to the terminal 6. By the principle described above, the light power of the laser diode 311 decreases and until above constant light power is reached. On the contrary, if the light power of the laser diode 311 decreases, a low voltage is applied to the terminal 6 by the diode type selector 20. As a result, the light power of the laser diode 311 increases and then becomes the predetermined constant light power.

As described above, the automatic laser power control circuit according to the present invention provides an advantage that a monitor diode can be compatibly used regardless of its ground type.

While only certain embodiments of the invention have been specifically described herein, it will apparent that numerous modifications may be made thereto without departing from the spirit and scope of the invention.

What is claimed is:

1. An automatic laser power control circuit comprising:

a laser diode package for emitting laser light according to voltage supplied to said laser diode package, and outputting an electric signal representing a voltage proportional to the power of the emitted laser light;

a voltage adjusting unit for adjusting the voltage applied to said laser diode package based on said electric signal output from said laser diode package; and polarity adjusting means for changing a polarity of the voltage represented by said electric signal output from said laser diode package so that the polarity is the same as the polarity of the voltage applied to said laser diode package, and supplying the voltage having a changed polarity to said voltage adjusting unit.

2. The automatic laser power control circuit according to claim 1, wherein said polarity adjusting means comprises:

a buffer for maintaining and outputting the polarity of the voltage of said electric signal output from said laser diode package;

an inverting amplifier, connected to said buffer, for changing inversely the polarity of the voltage of said electric signal; and a multiplexer for selectively outputting one of an output from said buffer and an output from said inverting amplifier according to a selection control signal provided from an external source.

3. The automatic laser power control circuit according to claim 2, wherein said selection control signal is preset to a predetermined value according to a grounding arrangement of diodes included in said laser diode package.

* * * * *